US008717126B2

(12) United States Patent
Yamada et al.

(10) Patent No.: US 8,717,126 B2
(45) Date of Patent: May 6, 2014

(54) STOPPER STRUCTURE FOR ROTARY OPERATION MEMBER, ELECTRONIC DEVICE, AND CHANNEL STOPPER

(75) Inventors: Tadahiro Yamada, Kanagawa-ken (JP); Shoji Ota, Kanagawa (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 519 days.

(21) Appl. No.: 12/929,039

(22) Filed: Dec. 23, 2010

(65) Prior Publication Data

US 2011/0181378 A1 Jul. 28, 2011

(30) Foreign Application Priority Data

Jan. 27, 2010 (JP) ................................ 2010-015821

(51) Int. Cl.
*H03J 1/06* (2006.01)

(52) U.S. Cl.
USPC ............................ 334/88; 455/90.3; 455/351

(58) Field of Classification Search
USPC ........ 200/11 R, 288, 336, 564, 566; 333/233, 333/235; 334/88; 455/90.3, 347, 351; 174/50
See application file for complete search history.

(56) References Cited

U.S. PATENT DOCUMENTS 5,430,249 A * 7/1995 Phelps et al. .................... 174/50

FOREIGN PATENT DOCUMENTS

| | | | |
|---|---|---|---|
| CN | 118362 | A | 6/1998 |
| DE | 10308450 | A1 | 9/2004 |
| EP | 1597742 | B1 | 2/2004 |
| JP | 2003-337628 | | 11/2003 |

OTHER PUBLICATIONS

Xanthos, M. and Todd D.B., Plastics Processing, "Encyclopedia of Polymer Science and Technology", John Wiley and Sons, Mar. 2004.*

* cited by examiner

*Primary Examiner* — Benny Lee
(74) *Attorney, Agent, or Firm* — Louis Woo

(57) ABSTRACT

A stopper structure includes a wall defining an opening. A rotary electronic component has a rotational shaft extending through the opening. A channel stopper has a tubular body and an engagement projection. The tubular body is detachably mounted onto the rotational shaft and is inhibited from rotating relative thereto. The engagement projection extends from an end of the tubular body in an axial direction and a radial direction with respect to the rotational shaft. A rotary operation member is detachably mounted onto the rotational shaft and the tubular body and is inhibited from rotating relative thereto. The rotary operation member has an axial hole in which at least portions of the rotational shaft and the tubular body fit. A limiting portion provided on the wall is engageable with the engagement projection for limiting a range of rotation of the rotational shaft.

4 Claims, 3 Drawing Sheets

STOPPER STRUCTURE FOR ROTARY OPERATION MEMBER, ELECTRONIC DEVICE, AND CHANNEL STOPPER

BACKGROUND OF THE INVENTION

1. Field of the Invention

This invention relates to a stopper structure for limiting the range of rotation of a rotary operation member designed to operate, for example, a rotary encoder switch provided in a radio communication device and used to change radio channels. This invention further relates to an electronic device and a channel stopper.

2. Description of the Related Art

Some business-use radio communication devices or portable radio communication devices have rotary encoder switches for changing radio channels. The rotary encoder switches each have a rotational shaft. As the rotational shaft is rotated, the radio channel is changed.

It is known to mount a rotary operation member accessible by a user on the rotational shaft of a rotary encoder switch. As the rotary operation member is rotated by the user, the encoder shaft also is rotated so that the radio channel is changed. Thus, the user can tune the related device to a desired radio channel by actuating the rotary operation member. A typical rotary operation member is designed so that it can be held between user's fingers when being rotated by the user.

Business-use radio communication devices are often used for communications between persons in a building site or persons doing inspection work. It is usual that a user carries a radio communication device on his waist belt. The user often struggles with an operation part (for example, a rotary operation member) of the device on the belt when using the device. Thus, in the case where an excessively large number of selectable radio channels is assigned to one rotary operation member, it tends to be difficult for the user to correctly determine which of the channels is being selected when he actuates the rotary operation member. If the number of selectable radio channels assigned to one rotary operation member is smaller, correct channel section can be more easily implemented.

With respect to a radio communication device on user's waist belt, an example of channel selection performed by the user is as follows. Firstly, the user struggles with the rotary operation member and rotates the member in one direction until the member contacts a fixed stopper provided on the device. Secondly, the user struggles with the rotary operation member and rotates the member in a reverse direction until the device tunes in to a desired radio channel. Sometimes the user would handle the rotary operation member roughly while performing channel selection. Rough handling of the rotary operation member causes a great impact when the member comes into contact with the stopper. Thus, it is desirable that the rotary operation member, the stopper, and the body of the device are strong enough to withstand such a great impact. Furthermore, it is desirable that the rotary operation member, the stopper, and the body of the device are durable.

Japanese patent application publication number 2003-337628 discloses a mechanism for limiting the range of rotation of an operation member (see FIGS. 1 and 2 therein). In FIGS. 1 and 2 of Japanese patent application 2003-337628, the chassis of a radio communication device has an opening through which the rotational shaft of a rotary encoder projects outward. An operation member is mounted on the projecting part of the encoder shaft. As the operation member is rotated, the encoder shaft rotates accordingly. The operation member has an axially-extending projection at a place in its outer circumferential edge. A limiting member formed by a small member is mounted on the chassis for cooperation with the projection of the operation member. Specifically, the inner circumferential edge of the chassis which defines the opening has small recesses spaced circumferentially. The limiting member fits into one of the recesses in a manner such that a portion of the member projects axially from the recess and can contact with the projection of the operation member. The operation member can be rotated until the projection thereof meets the limiting member. The rotation of the operation member is stopped when the projection meets the limiting member. In this way, the rotation of the operation member is limited.

In Japanese patent application 2003-337628, the limiting member is formed by the small member, and tends to have a problem with its strength. The inner circumferential edge of the chassis which defines the opening has a complicated shape so that the chassis is difficult to make.

Japanese patent application 2003-337628 further discloses another mechanism for limiting the range of rotation of an operation member (see FIG. 7 therein). In FIG. 7 of Japanese patent application 2003-337628, a ring-shaped stopper formed by a metal plate and having a stopping projection cooperates with a projection of an operation member. The stopper is fixed to the chassis of a radio communication device by a nut used mainly for attaching the body of a rotary encoder to the chassis. As the thickness of the stopper is smaller, the strength thereof decreases and the stopper tends to more easily bite into the operation member. As the thickness of the stopper is greater, the stopper is more reliably prevented from biting into the operation member. The stopper having a greater thickness however works against the compactness of the radio communication device. To remove the stopper or change the position thereof, it is necessary to loosen the nut through the use of a tool.

SUMMARY OF THE INVENTION

It is a first object of this invention to provide a stopper structure for a rotary operation member which is advantageous in regard to the number of parts, cost, durability, assembling and mounting, and replacement of parts.

It is a second object of this invention to provide an electronic device which is advantageous in regard to the number of parts, cost, durability, assembling and mounting, and replacement of parts.

It is a third object of this invention to provide a channel stopper which is advantageous in regard to the number of parts, cost, durability, assembling and mounting, and replacement of parts.

A first aspect of this invention provides a stopper structure comprising a wall defining an opening; a rotary electronic component having a rotational shaft extending through the opening; a channel stopper having a tubular body and an engagement projection, the tubular body being detachably mounted on the rotational shaft and being inhibited from rotating relative to the rotational shaft, the engagement projection extending from an end of the tubular body in an axial direction and a radial direction with respect to the rotational shaft; a rotary operation member detachably mounted on the rotational shaft and the tubular body and being inhibited from rotating relative to the rotational shaft and the tubular body, the rotary operation member having an axial hole in which at least portions of the rotational shaft and the tubular body fit; and a limiting portion provided on the wall and being engageable with the engagement projection for liming a range of rotation of the rotational shaft.

A second aspect of this invention provides an electronic device comprising an operation panel having a wall defining an opening; a rotary electronic component having a rotational shaft extending through the opening; a channel stopper having a tubular body and an engagement projection, the tubular body being detachably mounted on the rotational shaft and being inhibited from rotating relative to the rotational shaft, the engagement projection extending from an end of the tubular body in an axial direction and a radial direction with respect to the rotational shaft; a rotary operation member detachably mounted on the rotational shaft and the tubular body and being inhibited from rotating relative to the rotational shaft and the tubular body, the rotary operation member having an axial hole in which at least portions of the rotational shaft and the tubular body fit; and a limiting portion provided on the wall and being engageable with the engagement projection for liming a range of rotation of the rotational shaft.

A third aspect of this invention provides a channel stopper for use in an electronic device including an operation panel having a wall defining an opening, a rotary electronic component having a rotational shaft extending through the opening, and a limiting portion provided on the wall. The channel stopper comprises a tubular body detachably mounted on the rotational shaft and being inhibited from rotating relative to the rotational shaft; and an engagement projection extending from an end of the tubular body in an axial direction and a radial direction with respect to the rotational shaft, the engagement projection being engageable with the limiting portion for liming a range of rotation of the rotational shaft.

A fourth aspect of this invention is based on the third aspect thereof, and provides a channel stopper wherein the tubular body and the engagement projection are integral with each other, and are made of resin.

This invention provides the advantages explained below. A channel stopper is mounted on a rotational shaft, and fits in an axial hole of a rotary operation member. Thus, a sufficiently wide space can be formed between ends of the rotary operation member and the channel stopper and a member surface defining a bottom of an opening through which the rotational shaft extends. The space is used to accommodate an engagement projection provided on the channel stopper and having a sufficient axial-direction length and a sufficient radial-direction width. An increase in the number of parts, an increase in cost, and a decrease in durability are avoided. The channel stopper is prevented from biting into the rotary operation member even in the case where the rotary operation member is made of resin. It is easy to mount the channel stopper on the rotational shaft, and the channel stopper is easily replaced with another.

BRIEF DESCRIPTION OF THE DRAWINGS

FIG. 2(*b*) is a longitudinal cross-sectional view of the operation part of the radio communication device shown in FIG. 1(*a*) where the rotary operation member has been removed;

FIG. 2(*c*) is a cross-sectional view of the operation part of the radio communication device of FIG. 1(*a*) taken along the line A-A in FIG. 2(*a*)

DETAILED DESCRIPTION OF THE INVENTION

Figure 1B:
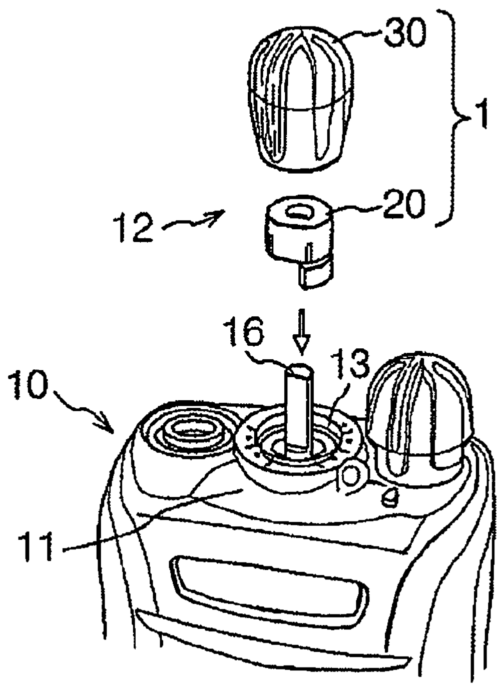
FIGS. 1(*a*), 1(*b*), and 1(*c*) are perspective views of an operation part of a portable radio communication device having a stopper structure for a rotary operation member in an embodiment of this invention.
Figure 1A:
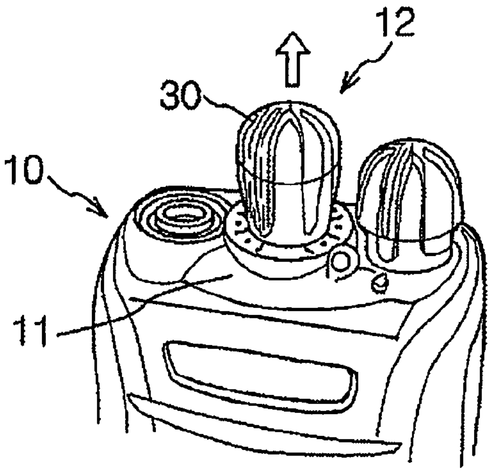
Figure 1C:
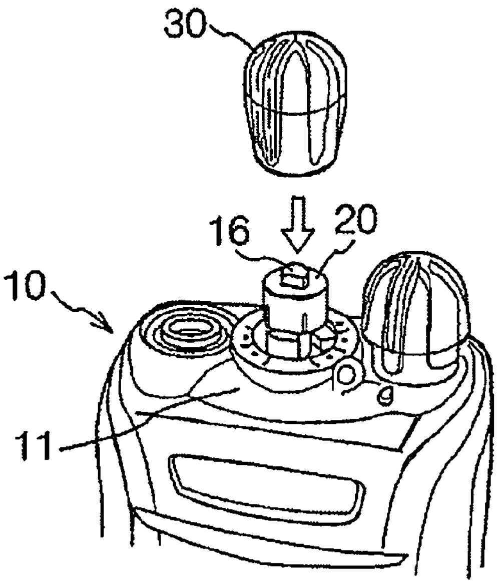

With reference to FIGS. 1(*a*)-1(*c*), an embodiment of a portable radio communication device or an electronic device 10 of the instant invention is shown to have an operation part 12 [FIGS. 1(*a*), 1(*b*)] provided with a stopper structure 1. The stopper structure 1 is a means for limiting the range of rotation of a rotary operation member 30 [FIGS. 1(*b*), 1(*c*), 2(*a*) and 2(*b*)] accessible by a user and designed to operate a rotary encoder switch (a rotary electronic component) 15 [FIGS. 2(*a*) and 2(*b*)] in the radio communication device 10. The rotary encoder switch 15 is supported by the body or chassis of the radio communication device 10. The range of rotation of the rotary operation member 30 determines the number or range of radio channels usable by the radio communication device 10.

The rotary operation member 30 is included in the operation part 12 of the radio communication device 10, and is connected with the rotary encoder switch 15. The stopper structure 1 is designed to allow easy implementation of change in the range of rotation of the rotary operation member 30, that is, change in the number or range of radio channels usable by the radio communication device 10.

The radio communication device 10 has a panel 11 furnished with the operation part 12. The panel 11 is made of, for example, resin. As previously mentioned, the operation part 12 is provided with the stopper structure 1.

The stopper structure 1 includes at least a portion of the rotary encoder switch 15, a channel stopper 20 [FIGS. 1(*b*), 1(*c*) and 2(*a*)-2(*c*)], the rotary operation member 30, and a limiting member or portion for cooperation with the channel stopper 20. The radio communication device 10 has a casing located inward of the panel 11. The rotary encoder switch 15 has a body placed in the casing and a rotational shaft 16 [FIGS. 1(*b*), 1(*c*) and 2(*a*)-2(*c*)] made of metal. The range of rotation of the encoder shaft 16 determines the selectable radio channel number or range of the radio communication device 10. The encoder shaft 16 projects from the body of the radio communication device 10 and extends coaxially through a circular opening 13 [FIGS. 1(*b*), 2(*a*), 2(*b*) and 2(*c*)] in the panel 11. Thus, the encoder shaft 16 projects outwardly from the panel 11. The bottom of the opening 13 is defined by a ring member in the radio communication device 10, the walls of a portion of the body, or the casing of the radio communication device 10. The channel stopper 20 is made of, for example, resin. The channel stopper 20 is detachably mounted on the encoder shaft 16. The channel stopper 20 has an axial hole 21 [FIGS. 2(*a*), 2(*b*) and 3(*a*)-3(*c*)] accommodating the encoder shaft 16. The channel stopper 20 can rotate together with the encoder shaft 16. The connection or relation between the channel stopper 20 and the encoder shaft 16 is designed to allow co-rotation thereof but inhibit relative rotation therebetween. The rotary operation member 30 has axial holes 31 and 32 [FIG. 2(*a*)] continuous with each other. The inside diameter of the axial hole 31 is smaller than that of the axial hole 32. The axial hole 31 extends deeper into rotary member 30 than the axial hole 32. The rotary operation member 30 is detachably mounted on the encoder shaft 16 and the channel stopper 20. The distal end of the encoder shaft 16 fits into the axial hole 31 while the channel stopper 20 fits into the axial hole 32 in the rotary operation member 30. The encoder shaft 16 is rotatable together with the rotary operation member 30. Accordingly, the channel stopper 20 is rotatable together with the rotary operation member 30. The connection or relation between the rotary operation member 30 and the encoder shaft 16 is designed to allow co-rotation thereof but inhibit relative rotation therebetween. In addition, the connection or relation between the rotary operation member 30 and the channel stopper 20 is designed to allow co-rotation thereof but inhibit relative rotation therebetween.

The encoder shaft 16 has a non-cylindrical shape. Specifically, the encoder shaft 16 has a cross section of a non-circular shape such as a D-cut shape or a circle-segment shape. Preferably, the encoder shaft 16 has a flat D-cut surface 16*a* [FIG. 2(*c*)] extending axially. The axial hole 21 of the channel stopper 20 and the axial hole 31 in the rotary operation member 30 conform with the encoder shaft 16 so that the channel-stopper walls defining the axial hole 21 and the rotary-operation-member walls defining the axial hole 31 are in substantially close contact with the encoder shaft 16 when the encoder shaft 16 is fitted to the axial holes 21 and 31. Preferably, the channel-stopper walls defining the axial hole 21 has a flat D-cut surface 21*a* [FIGS. 2(*c*) and 3(*a*)-3(*c*)] extending axially. The flat D-cut surface 21*a* of the channel stopper 20 and the flat D-cut surface 16*a* of the encoder shaft 16 are in plane-to-plane contact so that the channel stopper 20 and the encoder shaft 16 will be rotatable together while being inhibited from rotating relative to each other.

Figure 2A:
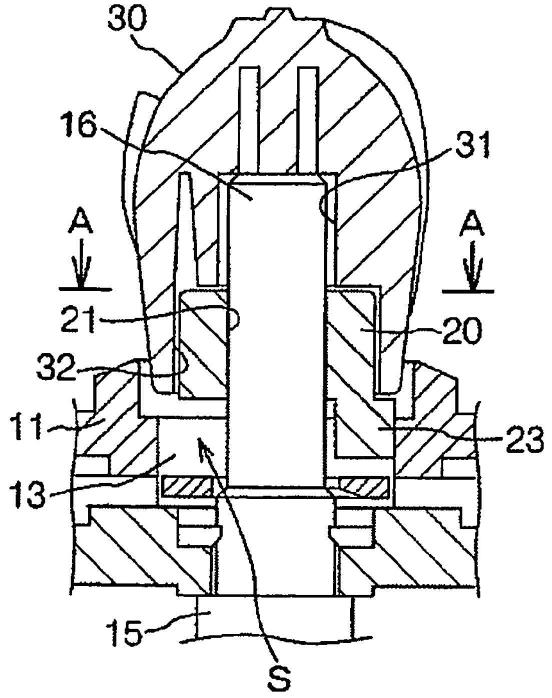
FIG. 2(*a*) is a longitudinal cross-sectional view of the operation part of the radio communication device shown in FIG. 1(*a*)
Figure 2B:
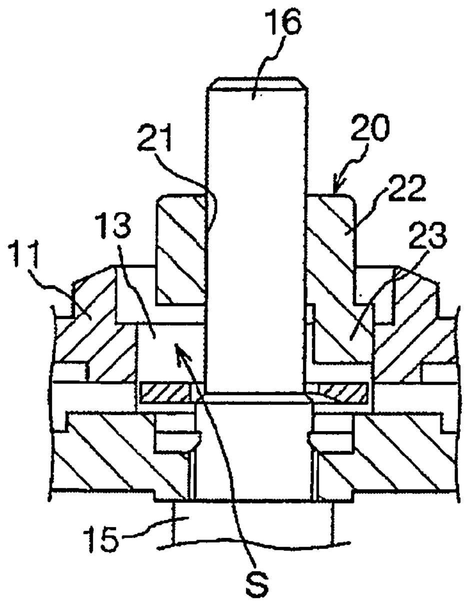
Figure 2C:
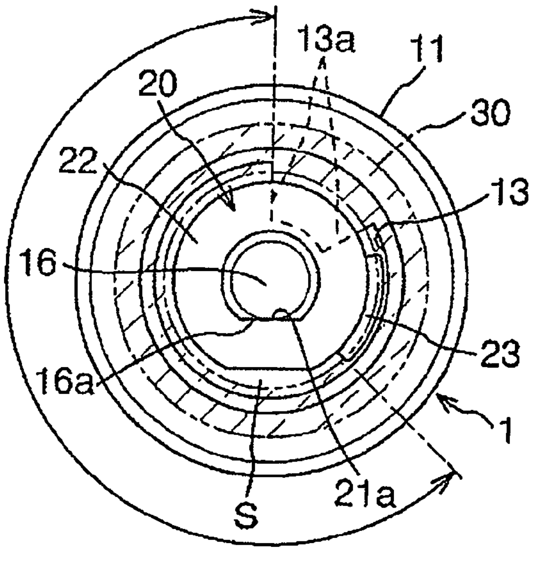
Figure 3A:
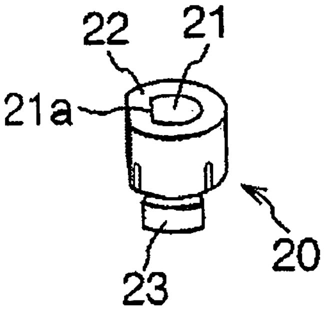
FIGS. 3(*a*), 3(*b*), and 3(*c*) are perspective views of examples of different channel stoppers each usable in the radio communication device of FIG. 1(*a*).
Figure 3B:
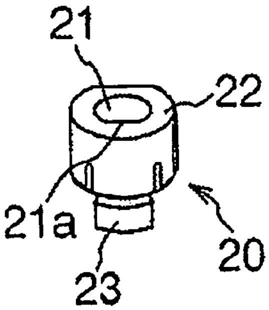
Figure 3C:
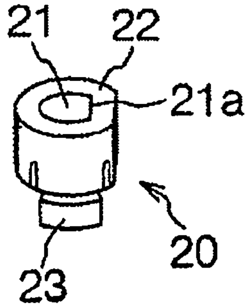

The channel stopper 20 has a tubular body 22 [FIGS. 3(*b*) and 2(*c*)] and an engagement projection 23 [FIGS. 2(*a*)-2(*c*)] integral with the tubular body 22. The channel stopper 20 is formed by, for example, molding such as injection molding. The tubular body 22 has the axial hole 21. The engagement projection 23 extends axially downward and radially outward from a lower end of the tubular body 22. The engagement projection 23 has thick walls.

A portion of the outer surfaces of the tubular body 22 is formed with a flat surface during injection molding. The position of this portion of the tubular body 22 is chosen so as not to interfere with the rotary operation member 30.

An upper portion of the encoder shaft 16 fits into the axial hole 31 in the rotary operation member 30. The axial hole 32 in the rotary operation member 30 extends continuously and downwardly from the axial hole 31. The rotary-operation-member walls defining the axial hole 32 are in close contact with the outer circumferential surface of the tubular body 22 of the channel stopper 20. The axial hole 32 conforms with the corresponding portion of the tubular body 22. The connection or relation between the rotary operation member 30 and the tubular body 22 is designed to allow co-rotation thereof but inhibit relative rotation therebetween.

A fixed limiting portion 13*a* [FIG. 2(*c*)] included in the stopper structure 1 is provided in the opening 13 of the panel 11. The limiting portion 13*a* is secured to, for example, the panel 11 or the body (or casing) of the radio communication device 10. The limiting portion 13*a* may be integrally formed with the panel 11 or the body (or casing) of the radio communication device 10. The walls of the panel 11 which define the opening 13 may have a shape having a radially inward projection forming the limiting portion 13*a*. The limiting portion 13*a* is made of, for example, resin. Preferably, the dimension and shape of the limiting portion 13*a* are chosen to provide it with a sufficient strength. The limiting portion 13*a* is located in the path of travel (rotation) of the engagement projection 23 of the channel stopper 20. Thus, the limiting portion 13*a* and the engagement projection 23 are engageable with each other. As the channel stopper 20 rotates together with the encoder shaft 16 and the rotary operation member 30, the engagement projection 23 would make contact with the limiting portion 13*a*. Rotation of the channel stopper 20 is stopped when the engagement projection 23 makes contact with the limiting portion 13*a*. Thus, the limiting portion 13*a* and the engagement projection 23 cooperate with each other, and thereby determine the range of rotation of the channel stopper 20, that is, the range of rotation of the rotary operation member 30 or the encoder shaft 16 with which the channel stopper 20 rotates together.

The tubular body 22 of the channel stopper 20 fits into the axial hole 32 in the rotary operation member 30. The engagement projection 23 of the channel stopper 20 is located axially below the lower end of the rotary operation member 30. The inside diameter of the opening 13 in the panel 11 is sufficiently greater than the outside diameter of the encoder shaft 16 so that an annular space S [FIGS. 2(*a*)-2(*c*)] is formed among the lower end of the rotary operation member 30, the lower end of the tubular body 22 of the channel stopper 20, the panel walls defining the opening 13, the portion of the encoder shaft 16, and the ring member or the portion of the body (or casing) of the radio communication device 10 which defines the bottom of the opening 13. The limiting portion 13*a* is located in the space S. It is preferable that the space S is sufficiently wide and large.

Under the conditions where the channel stopper 20 has been mounted on the encoder shaft 16, the engagement projection 23 of the channel stopper 20 is located in the space S. As the rotary operation member 30 is rotated, the engagement projection 23 rotates circumferentially in the space S together with the rotary operation member 30 until making contact with the limiting portion 13*a*. The engagement projection 23 is inhibited from rotating further when it makes contact with the limiting portion 13*a*.

Preferably, channel stoppers 20, which are adapted to be positioned in a different orientation than the engagement projection 23 relative to the tubular body 22 and have a different width (circumferential dimension) than the engagement projection 23, are prepared in advance. These channel stoppers 20 are designed to provide different respective ranges of rotation for the rotary operation member 30 and the encoder shaft 16. One is selected from the different channel stoppers 20 before being actually used in the radio communication device 10. Thus, the range of rotation of the rotary operation member 30 or the encoder shaft 16, that is, the selectable radio channel number or range of the radio communication device 10, can be varied or adjusted by selectively choosing one channel stopper from the different channel stoppers 20.

FIGS. 3(*a*), 3(*b*), and 3(*c*) show examples of three different channel stoppers 20 prepared in advance. These channel stoppers 20 are different in terms of being positioned or oriented to the engagement projection 23 relative to the tubular body 22. Alternatively, the channel stoppers 20 may have different widths (circumferential dimensions).

The channel stopper 20 in the radio communication device 10 is designed as follows. The tubular body 22 and the engagement projection 23 of the channel stopper 20 are integral with each other. The engagement projection 23 is located axially below the tubular body 22. The engagement projection 23 has thick walls. The engagement projection 23 extends from the tubular body 22 in a manner such that a portion of the engagement projection 23 extends radially from the outer circumferential surface of the tubular body 22. The engagement projection 23 has an inner arcuate surface approximately equal in radial position to the inner circumferential surface of the tubular body 22. The engagement projection 23 has an outer arcuate surface in a position radially outward of the outer circumferential surface of the tubular body 22. The thickness along the radial-direction of the walls of the engagement projection 23 is sufficiently thick to provide a sufficiently strong engagement projection 23. Preferably, the radial-direction length of the engagement projection 23 is as small as possible so that the outer arcuate surface of the engagement projection 23 is approximately equal in radial position to the outer circumferential surface of a lower portion of the rotary operation member 30. Thus, the engagement projection 23 does not require the outside diameter of the rotary operation member 30 to be set to a large value. Accordingly, it is unnecessary to set the diameter of the opening 13 in the panel 11 to a large value.

During the assembly of the radio communication device 10, the channel stopper 20 and the rotary operation member 30 are successively mounted on the encoder shaft 16. It is easy to remove the channel stopper 20 and the rotary operation member 30 from the encoder shaft 16. It is unnecessary to provide a screw for fixing the channel stopper 20 to the panel 11.

As discussed above, the different channel stoppers 20 for use with the engagement projection 23 are prepared in advance. As the channel stoppers 20 are designed to provide different respective ranges of rotation of the rotary operation member 30 and the encoder shaft 16, the selected channel stopper 20 used for the assembly of the radio communication device 10 can selectively set the range of rotation of the rotary operation member 30 or the encoder shaft 16. In other words, the selectable radio channel range (or number) of the radio communication device 10 can be arbitrarily set to prescribed ranges by selectively using one of the different channel stoppers 20 without needing a tool. The selectable radio channel number or range of the radio communication device 10 can be easily changed by replacing the channel stopper 20 being used in the radio communication device 10 with another channel stopper.

The channel stopper 20 is mounted onto the encoder shaft 16 rather than being fixed to the panel 11. Specifically, the encoder shaft 16 extends through the channel stopper 20. The connection or relation between the channel stopper 20 and the encoder shaft 16 is designed to allow the channel stopper 20 to rotate together with the encoder shaft 16. The inner wall of the axial hole 32 and the outer circumferential surface of the tubular body 22 of the channel stopper 20 co-act to allow co-rotation of the channel stopper 20 and the rotary operation member 30 but inhibit relative rotation therebetween. The lower end of the tubular body 22 of the channel stopper 20 is approximately equal in axial position to the lower end of the rotary operation member 30. The space S is formed below the lower end of the tubular body 22 and the lower end of the rotary operation member 30. Thus, the axial-direction width of the space S can be set to a great value without making the rotary operation member 30 and the opening 13 large in size. This space S allows the engagement projection 23 placed therein to have a larger width along the axial-direction. The channel stopper 20 provides a structure which avoids interference between the rotary operation member 30 and the panel 11.

Preferably, the limiting portion 13*a* is provided on the panel 11. The limiting portion 13*a* may be integral with the panel 11. The limiting portion 13*a* is placed in the space S. Generally, the space S is in the form of an annulus located between the outer circumferential surface of the encoder shaft 16 and the inner circumferential surface of the panel 11 which defines the opening 13. The range of rotation of the rotary operation member 30 (that is, the range of rotation of the encoder shaft 16) is defined by the meeting of the engagement projection 23 with the limiting portion 13*a*. Thus, the engagement projection 23 in the space S can be made to have as large as possible respective thicknesses in the radial-direction and the axial-direction. Accordingly, the engagement projection 23 can be sufficiently strong. Therefore, even in the case where the limiting portion 13*a* and the engagement projection 23 are made of resin, they can be prevented from cutting into each other.

The rotary operation member 30 is mounted on the encoder shaft 16 and the tubular body 22 of the channel stopper 20. Specifically, the rotary operation member 30 extends around an upper portion of the encoder shaft 16. The tubular body 22 of the channel stopper 20 fits into the axial hole 32 formed in a lower portion of the rotary operation member 30. The tubular body 22 and the rotary operation member 30 are designed to allow co-rotation thereof but inhibit relative rotation therebetween. The space S is formed below the rotary operation member 30 and the tubular body 22. The engagement projection 23 extends from the lower end of the tubular body 22. Only the engagement projection 23 may be placed in the space S. Thus, as long as the engagement projection 23 is placeable in the space S, the size of the engagement projection 23 can be large without needing to increase the respective sizes of the rotary operation member 30 and the opening 13. Accordingly, the engagement projection 23 and the channel stopper 20 can be sufficiently strong. It is unnecessary to use a fixing member such as a nut for the mounting of the channel stopper 20. Thus, it is possible to reduce the number of parts used for the radio communication device 10 and the number of steps of assembling the radio communication device 10. While the radio communication device 10 is kept in substantially a shipment state, the channel stopper 20 can be attached to or removed from the radio communication device 10 without using a tool. Thus, the channel stopper 20 can be replaced by another without using a tool. In the case where the channel stopper 20 is made of resin, a lower cost of the radio communication device 10 can be realized.

The channel stopper 20 is directly mounted on the encoder shaft 16. This design effectively suppresses the occurrence of a positional error of the channel stopper 20 relative to the encoder shaft 16.

To further increase the strengths of the engagement projection 23 and the limiting portion 13*a*, it is preferable to set the circumferential-direction lengths thereof to sufficiently large values.

In the case where the user carries the radio communication device 10 on his waist belt, the user often struggles with the rotary operation member 30 when using the radio communication device 10. In such a case, sometimes the user roughly handles the rotary operation member 30. Being sufficiently strong, the engagement projection 23 and the limiting portion 13*a* are prevented from being damaged by the rough handling of the rotary operation member 30. Therefore, the radio communication device 10 is excellent in durability.

For good usability and design, it is preferable to provide proper dimensional proportions between the radio communication device 10 and the rotary operation member 30. It is undesirable to make the rotary operation member 30 excessively large in size relative to the radio communication device 10. Accordingly, there are certain restrictions on the size and shape of the rotary operation member 30. Since the channel stopper 20 is partially placed in the axial hole 32 of the rotary operation member 30, there are certain restrictions on the size and shape of the channel stopper 20 also. The sufficiently wide space S can be provided below the rotary operation member 30 and the tubular body 22 of the channel stopper 20 without increasing the size of the rotary operation member 30. The engagement projection 23 of the channel stopper 20 is located in the space S and is rotatable therein. Thus, the sufficiently strong engagement projection 23 of the channel stopper 20 can be placed in the space S while good usability and appearance of the rotary operation member 30 are maintained. The channel stopper 20 can be sufficiently strong even when being made of low-cost resin.

There are provided the following advantages. In the stopper structure 1, the channel stopper 20 is mounted on the encoder shaft 16 while the encoder shaft 16 extends through the axial hole 21 of the channel stopper 20. The distal end of the encoder shaft 16 fits into the axial hole 31 in the rotary operation member 30. Thus, the space S which is sufficiently wide is formed between the lower ends of the rotary operation member 30 and the channel stopper 20 and the walls defining the bottom of the opening 13. Therefore, the channel-stopper engagement projection 23 placed in the space S is allowed to have sufficient axial-direction length and radial-direction width. Accordingly, the engagement projection 23 can be sufficiently strong even when being made of resin. The channel stopper 20 is supported by the encoder shaft 16 in a manner to allow co-rotation thereof but inhibit relative rotation therebetween. The outer circumferential surface of the tubular body 22 of the channel stopper 20 is held by the rotary operation member 30. Thus, the channel stopper 20 can be manually mounted on the encoder shaft 16 without using a fixing member such as a nut.

What is claimed is:

1. A stopper structure comprising:

a wall defining an opening;

a rotary electronic component having a rotational shaft extending through the opening;

a channel stopper having a tubular body and an engagement member, the tubular body being detachably mounted on the rotational shaft and being inhibited from rotating relative to the rotational shaft, the engagement member projecting from an end of the tubular body in an axial direction and a radial direction with respect to the rotational shaft;

a rotary operation member detachably mounted on the rotational shaft and the tubular body and being inhibited from rotating relative to the rotational shaft and the tubular body, the rotary operation member having an axial hole whereinto at least respective portions of the rotational shaft and the tubular body fit; and a limiting portion provided on the wall engageable with the engagement member for limiting a range of rotation of the rotational shaft;

wherein the engagement member projects from the end of the tubular body in an axial direction away from the tubular body.

2. An electronic device comprising:

an operation panel having a wall defining an opening;

a rotary electronic component having a rotational shaft extending through the opening;

a channel stopper having a tubular body and an engagement member, the tubular body being detachably mounted on the rotational shaft and being inhibited from rotating relative to the rotational shaft, the engagement member projecting from an end of the tubular body in an axial direction and a radial direction with respect to the rotational shaft;

a rotary operation member detachably mounted on the rotational shaft and the tubular body and being inhibited from rotating relative to the rotational shaft and the tubular body, the rotary operation member having an axial hole whereinto at least respective portions of the rotational shaft and the tubular body fit; and a limiting portion provided on the wall engageable with the engagement member for limiting a range of rotation of the rotational shaft;

wherein the engagement member projects from the end of the tubular body in an axial direction away from the tubular body.

3. A channel stopper for use in an electronic device including an operation panel having a wall defining an opening, a rotary electronic component having a rotational shaft extending through the opening, and a limiting portion provided on the wall, the channel stopper comprising:

a tubular body detachably mounted on the rotational shaft and being inhibited from rotating relative to the rotational shaft; and an engagement member extending from an end of the tubular body in an axial direction and a radial direction with respect to the rotational shaft, the engagement member engageable with the limiting portion for limiting a range of rotation of the rotational shaft;

wherein the engagement member projects from the end of the tubular body in an axial direction away from the tubular body.

4. A channel stopper as recited in claim 3, wherein the tubular body and the engagement member are integral with each other, and are made of resin.

* * * * *